United States Patent [19]
Varadarajan

[11] Patent Number: 4,687,953
[45] Date of Patent: Aug. 18, 1987

[54] DYNAMIC ECL LINE DRIVER CIRCUIT

[75] Inventor: Hemmige D. Varadarajan, Sunnyvale, Calif.

[73] Assignee: Advanced Micro Devices, Inc., Sunnyvale, Calif.

[21] Appl. No.: 853,504

[22] Filed: Apr. 18, 1986

[51] Int. Cl.[4] .................. H03K 19/086; H03K 17/04; H03K 19/01; H03K 19/013
[52] U.S. Cl. .................... 307/270; 307/443; 307/454; 307/455; 307/254
[58] Field of Search ............... 307/443, 454, 455, 456, 307/254, 270, 280, 300, 493, 494

[56] References Cited

U.S. PATENT DOCUMENTS

| | | | |
|---|---|---|---|
| 3,978,347 | 8/1976 | Hollstein et al. | 307/455 |
| 4,092,551 | 5/1978 | Howard et al. | 307/254 |
| 4,237,388 | 12/1980 | Nokubo et al. | 307/454 |
| 4,356,409 | 10/1982 | Masuda et al. | 307/455 X |
| 4,449,063 | 5/1984 | Ohmichi et al. | 307/456 |
| 4,533,838 | 8/1985 | Fujita | 307/455 X |
| 4,539,493 | 9/1985 | Varadarajan | 307/455 |

FOREIGN PATENT DOCUMENTS

| | | | |
|---|---|---|---|
| 0177278 | 4/1986 | European Pat. Off. | 307/455 |
| 68064 | 6/1978 | Japan | 307/254 |
| 115618 | 7/1984 | Japan | 307/455 |

OTHER PUBLICATIONS

Chang et al, "Complementary Driver for Emitter-Coupled-Logic Gates"; *IBM TDB*; vol. 19, No. 12, pp. 4614-4615; 5/1977.

Chan, "High Speed Current Switch Push-Pull Driver"; *IBM TDB*; vol. 24, No. 5, pp. 2635-2636; 10/1981.

Barish et al, "Current Switch Push-Pull Internal Circuit"; *IBM TDB*; vol. 24, No. 6, p. 3041; 11/1981.

Barry, "High Performance Current Switch Push-Pull Off-Chip Driver"; *IBM TDB*; vol. 26, No. 7B, pp. 3642-3643; 12/1983.

*Primary Examiner*—Stanley D. Miller
*Assistant Examiner*—Tai Duong
*Attorney, Agent, or Firm*—Patrick T. King; Davis Chin; J. Vincent Tortolano

[57] ABSTRACT

A dynamic ECL line driver circuit for driving line loads having significant capacitance which includes an input transistor, a reference transistor, a main current source transistor and an emitter follower transistor. The line driver circuit further includes a dynamic current enhancement circuit formed of a buffer portion, a current enhancement portion and a dynamic charge pumping portion. The current enhancement portion includes a current source enhancement transistor and the dynamic charge pumping portion includes a capacitor. The buffer portion is utilized for amplifying and inverting a transient voltage at the collector of the reference transistor. One end of the capacitor is connected to the collector of the reference transistor and the base of the emitter follower transistor, and the other end thereof is coupled to the base of the current source enhancement transistor via the buffer portion. As logic transitions occur at the base of the emitter follower transistor, the transient voltage is impressed upon the base of the current source enhancement transistor so as to speed up the transitions on an output terminal.

8 Claims, 4 Drawing Figures

DYNAMIC ECL LINE DRIVER CIRCUIT

BACKGROUND OF THE INVENTION

This invention relates generally to high speed ECL gate circuits and more particularly, its relates to an improved dynamic ECL line driver circuit for driving line Loads having a significant capacitance.

As is generally known, emitter-coupled logic (ECL) logic circuits have inherently low gate propagation delay times. However, when an ECL gate circuit is used to drive line loads having large capacitance, there will be a significant increase in the propagation delay times as the load capacitance of the output line increases. As a result, this increased propagation delay will have an impact on degrading the high performance in such ECL gate circuits. A standard ECL line driver circuit of the prior art is shown in FIG. 1 and has been designated "prior art". The line driver circuit of FIG. 1 will be discussed more fully hereinafter.

One attempt to overcome the capacitive loading problem for ECL gate circuits has been to utilize an opposite (out-of-phase) phase signal to the input signal to enhance the current in the load current source. This approach requires a separate bias voltage generator for the load current source which has additional wiring, thereby increasing manufacturing cost. Further, such prior art attempt has the disadvantage in that it is susceptible to noise spikes on the voltage supply line which were undistinguishable from a transition signal at the collector of the out-of-phase transistor. Due to these noises spikes, the signal on the output terminal behaved in an unpredictable manner. A prior art ECL circuit employing this technique is shown in FIG. 2 of U.S. Pat. No. 4,539,493 issued on Sept. 3, 1985. The patentee of this patent is the same inventor as in the present application, and the patent is assigned to the same assignee as this application.

It would therefore be desirable to provide a dynamic ECL line driver circuit for driving line loads having significant capacitance which is insensitive to noise spikes on the supply voltage line and which does not require a separate bias voltage generator. The dynamic ECL line driver circuit of the present invention was found to possess a substantial reduction in the downgoing transition delay time.

SUMMARY OF THE INVENTION

Accordingly, it is a general object of the present invention to provide an improved dynamic ECL line driver circuit which is relatively simple and economical to manufacture and assemble, but yet overcomes the disadvantage of the prior art line driver circuits.

It is an object of the present invention to provide a dynamic ECL line driver circuit for driving line loads having significant capacitance which is insensitive to the noise spikes on the supply voltage line.

It is another object of the present invention to provide an ECL line driver circuit which includes a dynamic current enhancement circuit to speed up the output transitions.

It is still another object of the present invention to provide an ECL line driver circuit which includes a reference voltage buffer portion, a current enhancement portion, and a dynamic charge pumping capacitance to speed up the output transitions.

In accordance with these aims and objectives, the present invention is concerned with the provision of an ECL line driver circuit for driving line loads having significant capacitance which include an input transistor, a reference transistor, a main current source transistor and an emitter follower transistor. The line driver further includes a dynamic current enhancement circuit formed of a buffer portion, a current source enhancement transistor, and a dynamic charge pumping capacitor. The buffer portion is utilized to amplify and invert a transient voltage at the collector of the reference transistor. One end of the dynamic charge pumping capacitor is connected to the collector of the reference transistor, and the other end of the capacitor is coupled to the base of the current source enhancement transistor via the buffer portion. The collector of the current source enhancement transistor is connected to an output terminal via the dynamic charge pumping capacitor, a transient increase or decrease in the voltage at the collector of the reference transistor will cause a decrease or increase in the current through the current source enhancement transistor, thereby speeding up the transition times on the output terminal.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENTS

Figure 1:
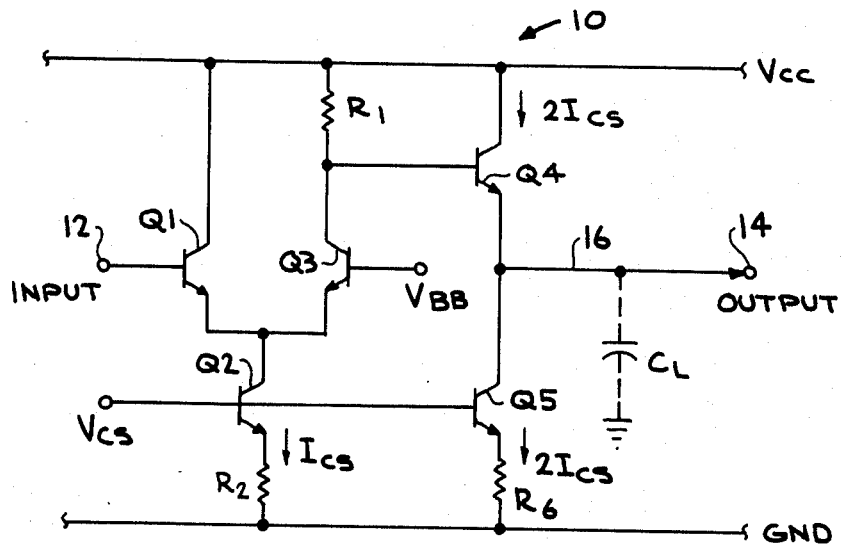
FIG. 1 is a schematic circuit diagram of a standard ECL line driver circuit of the prior art.

Referring now in detail to the drawings, there is shown in FIG. 1 a schematic circuit diagram of a standard ECL line driver circuit 10 of the prior art. The line driver circuit 10 includes an input transistor Q1 and a reference transistor Q3 whose emitters are connected together. The collector of the input transistor Q1 is connected to a supply voltage or potential VCC, and the collector of the reference transistor Q3 is connected to the supply potential VCC via a load resistor R1. The base of the transistor Q1 is connected to an input terminal 12 which receives an input logic signal swinging between a high or "1" logic level and a low or "0" logic level. The base of the transistor Q3 receives a reference voltage VBB which is typically midway between the high and low logic levels. A main current source is formed of a transistor Q2 and an emitter resistor R2 to provide a constant current $I_{CS}$. The transistor Q2 has its collector connected to the common emitters of the transistors Q1 and Q3, its base connected to a bandgap reference voltage VCS, and its emitter connected to a first end of the resistor R2. The second end of the resistor R2 is connected to a ground potential.

The line driver circuit 10 further includes an emitter follower transistor Q4 and a load current source consisting of a current source transistor Q5 and an emitter resistor R6. The current source transistor Q4 has its collector connected to the supply potential VCC and its base connected to the collector of the reference transistor Q3. The emitter of the transistor Q4 is connected to the collector of the current source transistor Q5 and to an output terminal 14 via a line 16. The transistor Q5 has its base connected to the bandgap reference voltage $V_{CS}$ and its emitter connected to a first end of the resistor R6. The other end of the resistor R6 is connected to the ground potential. Due to the length of the line 16 and the electrical properties of the associated topological features in an integrated circuit, there exists a load capacitance represented by $C_L$. One end of the capacitance $C_L$ is connected to the line 16, and the other end of the capacitance $C_L$ is connected to the ground potential. Typically, the capacitance $C_L$ has a value on the order of 1-10 pF.

The load current source provide a current equal to two times the current $I_{CS}$ (2 $I_{CS}$) in the main current source so as to facilitate discharging of the load capacitance $C_L$.

When a high or "1" logic level of the input logic signal is applied to the input terminal 12, the base of the emitter follower transistor Q4 is pulled up so that the capacitance $C_L$ is charged up through the transistor Q4. This causes the output terminal 14 to experience a low-to-high transition. Thus, the transistor Q4 functions to pull up the output line 16 whereas the transistor Q5 is a current source which serves to pull down the output line 16 and thus is current limited. On the other hand, when a low or "0" logic level of the input signal is applied to the input terminal 12, the base of the emitter follower transistor Q4 is pulled down so that the capacitance $C_L$ is discharged through the current source transistor Q5. This causes the output terminal 14 to experience a high-to-low transition. However, the current through the current source transistor Q5 which must sink the charge on the capacitance $C_L$ connected to the line 16 is finite and limited. As a result, the propagation delay times are effected by the load capacitance which must be charged and discharged. Further, as the load capacitance increases, the propagation delay times is also increased so as to degrade the inherent high speed operation of the ECL line driver circuit 10. In such conventional ECL driver circuits, the rise times (low-to-high transition) are typically on the order of 1-2 ns and the fall times (high-to-low transition) are typically on the order of 4-10 ns.

Figure 2:
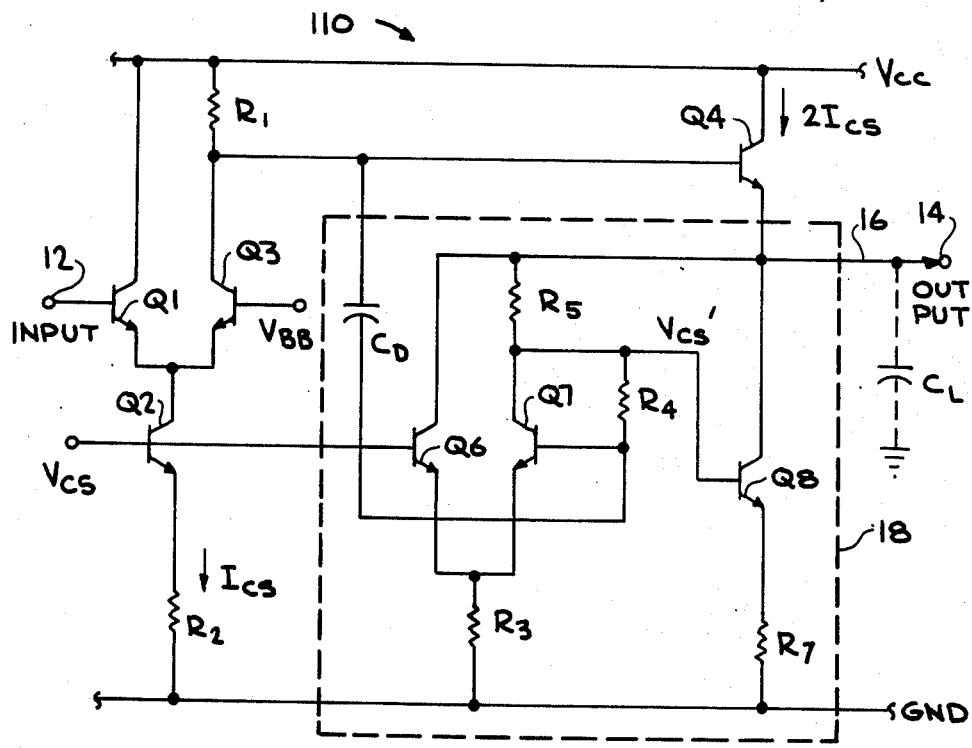
FIG. 2 is a schematic circuit diagram of a dynamic ECL line driver circuit of the present invention.

In order to substantially reduce these rise and fall times, there is illustrated in FIG. 2 an improved dynamic ECL line driver circuit 110 of the present invention which produces a superior performance over the standard ECL line driver circuit of FIG. 1. In FIG. 2, there is shown a standard ECL line driver circuit modified in accordance with the present invention. All of the components of FIG. 2 which are identical to those of FIG. 1 have been designated by the same reference numerals. The differences between the line driver circuit 110 of FIG. 2 and the line driver circuit 10 of FIG. 1 reside in the replacement of the load current source (Q5 and R6) by a dynamic current enhancement circuit 18 shown within the dotted Line.

The dynamic current enhancement circuit 18 includes a reference voltage buffer portion, a current enhancement portion, and a dynamic charge pumping means portion. The reference voltage portion comprises a first transistor Q6, a second transistor Q7 and a plurality of resistors R3, R4 and R5. The first transistor Q6 has its collector connected to the emitter of the emitter follower transistor Q4, its base connected to the bandgap reference voltage $V_{CS}$ and its emitter connected to the emitter of the second transistor Q7. The second transistor Q7 has its collector connected to a first end of the resistor R5 and its base connected to a first end of the resistor R4. The common emitters of the transistor Q6 and Q7 are connected to a first end of the resistor R3. The second end of the resistor R3 is connected to the ground potential. The second end of the resistor R4 is connected to the first end of the resistor R5 which produces a tracking voltage $V'_{CS}$ which tracks very closely the bandgap reference voltage $V_{CS}$ with temperature and device parameters.

The current enhancement portion consist of a current source enhancement transistor Q8 and a emitter resistor R7. The current source enhancement transistor Q8 has its collector connected to the emitter of the emitter follower transistor Q4, its base connected to the junction of the resistors R4 and R5, and its emitter connected to a first end of the resistor R7. The second end of the resistor R7 is connected to the ground potential. The dynamic charge pumping means portion consists of a capacitance $C_D$. One end of the capacitance $C_D$ is connected to the collector of the reference transistor Q3, and the other end of the capacitance $C_D$ is connected to the base of the second transistor Q7.

The operation of the dynamic ECL Line driver circuit 110 of FIG. 2 will now be explained in detail. Initially, it is assumed that the input logic signal applied to the input terminal 12 is at a high logic level so that the input transistor Q1 is turned on and the reference transistor Q3 is turned off. Thus, the collector of the transistor Q3 will be at the supply potential VCC. As a result, the emitter follower transistor Q4 is rendered more conductive and the load capacitance $C_L$ will be charged to a high level equal to the supply potential less the base-to-emitter voltage drop across the transistor Q4 or (VCC - $V_{BE}$). Now when the input logic signal is shifted down to the low logic level (wherein the output terminal 14 is experiencing a high-to-low transition) the collector of the in-phase reference transistor Q3 will also be moved downwardly.

Since this downgoing transition at the collector of the transistor Q3 is connected through the dynamic capacitor $C_D$ to the base of the second transistor Q7, the voltage on the base thereof will drop momentarily so as to cause the voltage at its collector to move upwardly, thereby raising momentarily the voltage at the base of the current source enhancement transistor Q8. As a result, the current flowing through the resistor R7 will be increased. Consequently, the charge on the capacitance $C_L$ is discharged quicker to the ground potential so as to assist in reducing significantly the high-to-low transition time at the output terminal 16.

When the input logic signal is shifted back to the high logic level (wherein the output terminal is experiencing a low-to-high transition) the collector of the reference transistor Q3 will be moving upwardly. Since this upgoing transition at the collector of the transistor Q3 is again connected through the dynamic capacitance to the base of the second transistor Q7, the voltage on the base thereof will rise momentarily so as to cause the voltage at its collector to move downwardly, thereby reducing momentarily the voltage at the base of the current source enhancement transistor Q8. As a result, the current flowing through the resistor R7 will he decreased. Consequently, the capacitance $C_L$ is charged up quicker to the high voltage level of $V_{CC} - V_{BE}$ so as to assist in reducing significantly the low-to-high transition at the output terminal 16.

As can be seen, the first and second transistors of the buffer portion in conjunction with the capacitance $C_D$ function as a dynamic signal amplifier for amplifying and inverting the transient voltage at the collector of the reference transistor to provide a signal in the opposite direction at the base of the current source enhancement transistor. It should be understood that the ECL line driver circuit of the present invention is dynamic in nature in that it supplies a transient boost to the current carrying capability of the current source enhancement transistor Q8 only when the collector of the in-phase transistor Q3 is experiencing a change. Once a steady state condition is reached (i.e., the collector remains at either a high level or low level), there will be no further contribution to the voltage at the base of the enhancement transistor Q8 until the next shift occurs. Thus, the tracking voltage $V'_{CS}$ will be at a steady state value approximately equal to the bandgap reference voltage $V_{CS}$.

Further, it will be appreciated that under steady state conditions, the buffer portion and the current enhancement portion will each draw a current equal to $I_{CS}$ so that the sum will be equal to the current of 2 $I_{CS}$ flowing through the load current source of FIG. 1. It is only when the tracking voltage $V'_{CS}$ changes due to a transition that the current drawn by the enhancement transistor Q8 either momentarily increases or decreases. When a transient increases the current (higher than $I_{CS}$) sunk by the enhancement transistor, this speed up the high-to-low transition time at the output terminal. When a transient decreases the current (lower than $I_{CS}$) flowing through the enhancement transistor, this speeds up the low-to-high transition time at the output terminal.

Figure 3:
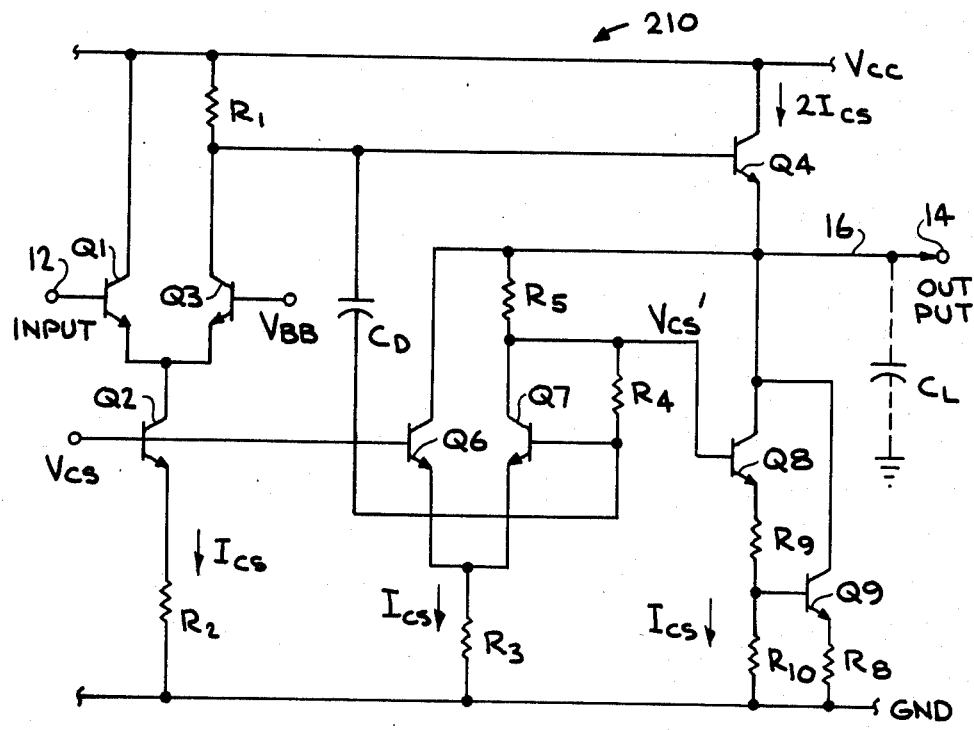
FIG. 3 is a schematic circuit diagram of another embodiment of the dynamic ECL line driver circuit of the present invention.

Another embodiment of the present invention is shown in FIG. 3. The ECL line driver circuit 210 of FIG. 3 contains all of the same components and their interconnection as in the circuit of FIG. 2 and further includes an additional load current source. The additional load current source consisting of a load current source transistor Q9 and an emitter resistor R8. The resistor R7 of FIG. 2 is replaced by series-connected resistors R9 and R10. A first end of the resistor R9 is connected to the emitter of the current enhancement transistor Q8, and the second end of the resistor R9 is joined to a first end of the resistor R10. The second end of the resistor R10 is tied to the ground potential. The load current source transistor Q9 has its collector connected to the emitter of the emitter follower transistor Q4 and its emitter connected to a first end of the resistor R8. The second end of the resistor R8 is tied to the ground potential.

Except for these changes, the operation of the circuit 210 of FIG. 3 is identical to the circuit of FIG. 2 and thus will not be repeated again. However, the ECL line driver circuit 210 will discharge quicker the load capacitance $C_L$ than that of the circuit 110 due to the additional load current source transistor Q9. It will be understood that when the transistor Q9 is rendered conductive during the high-to-low transition at the output terminal there will be an increased current flowing therethrough so as to discharge the line capacitance, thereby speeding up the downgoing transition.

The dynamic capacitance $C_D$ of FIGS. 2 and 3 is of a small value on the order of 0.05–0.1 pF. The capacitance $C_D$ may be formed of metal-to-metal, metal semiconductor, semiconductor junction or a combination thereof. A capacitance value of approximately 0.1 pF was found to be quite adequate for the circuits of FIGS. 2 and 3. When driving a load capacitance of 5 pF, there was found to be an improvement of 40 percent or more in the downgoing transition delay time over the standard ECL line driver circuit of FIG. 1.

Since multiple level logic is now common for ECL line driver circuits, the improved dynamic ECL line driver 210 of the present invention is applicable to such scheme by modifying the circuit 210 to include one or two diodes interconnected between the emitter of the emitter follower transistor Q4 and the collector of the current enhancement transistor Q8 so as to provide additional discrete logic levels. Of course, it will be appreciated to those skilled in the art that additional modifications may be required to accommodate the multiple level logic scheme such as the provision of additional input transistors and additional reference voltages for each level thereof.

Figure 4:
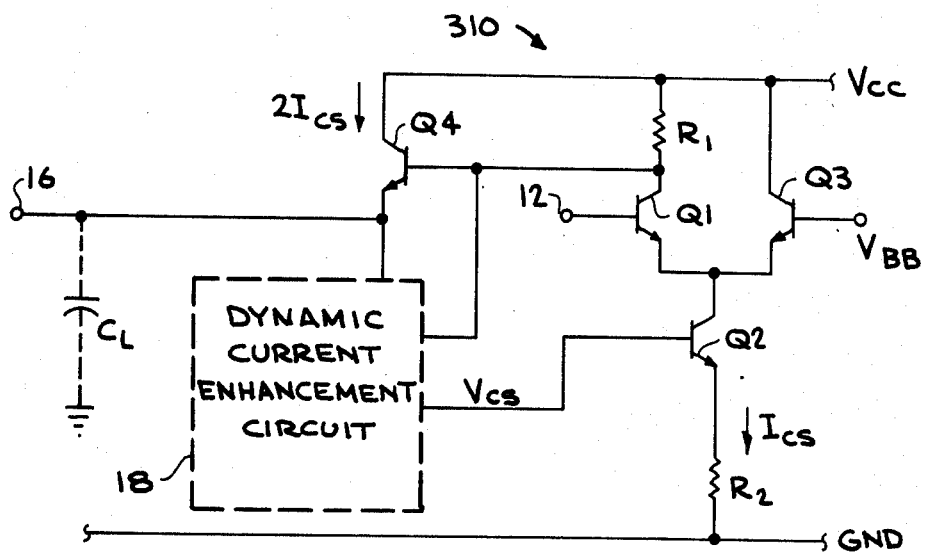
FIG. 4 is a schematic circuit diagram of yet another embodiment of the dynamic ECL line driver circuit of the present invention.

Yet another embodiment of the present invention is shown in FIG. 4. The ECL line driver circuit 310 of FIG. 4 contains all of the same components as the circuit of FIG. 2. However, the load resistor R1 is connected between the collector of the input transistor Q1 and the supply potential VCC. The base of the emitter follower transistor Q4 is connected to the collector of the input transistor Q1. The dynamic current enhancement circuit 18 within the dotted line is connected between the base and emitter of the transistor Q4 in a manner identical to that of FIG. 2. The output terminal 14 will now provide an output signal inverted from the input signal applied to input terminal 12. Except for these changes, the operation of the circuit 310 of FIG. 4 corresponds to the circuit 110 of FIG. 2. Alternately, additional load resistor, emitter follower transistor and dynamic current enhancement circuit could be connected to the input transistor Q1 of FIG. 2 if it is desired to speed up transitions on both the non-inverting and inverting output terminals.

From the foregoing detailed description, it can thus be seen that the present invention provides improved ECL line driver circuits for driving line loads having significant capacitance which includes a dynamic current enhancement circuit to speed up transitions at the output terminal. The ECL circuits of the present invention utilizes a dynamic capacitance to provide a transient increase or decrease in the current through a current source enhancement transistor for speeding of the transition times.

While there has been illustrated and described what are at present is considered to be preferred embodiments of the present invention, it will be understood by those skilled in the art that various changes and modifications may be made, and equivalents may be substituted for elements thereof with departing from the true scope of the invention. In addition, many modifications may be made to adapt a particular situation or material to the teachings of the invention without departing from the central scope thereof. Therefore, it is intended that this invention not be limited to the particular embodiments disclosed as the best modes contemplated for carrying out this invention, but that the invention will include all embodiments falling within the scope of the appended claims.

What is claimed is:

1. An ECL line driver circuit for driving line loads having significant capacitance comprising:

an input transistor having its collector coupled to a supply potential and its base connected to receive an input logic signal;

a reference transistor having its collector connected to the supply potential via a load resistor, its base connected to a bias voltage, and its emitter connected to the emitter of said input transistor;

a main current source transistor having its collector connected to the common emitters of said input transistor and said reference transistor, its base connected to a reference voltage, and its emitter connected to a ground potential via an emitter resistor;

an emitter follower transistor having its collector connected to the supply potential, its base connected to the collector of either said input or reference transistor, and its emitter connected to an output terminal;

buffer means formed of a first transistor and a second transistor for amplifying and inverting a transient voltage at the collector of said input or reference transistor, said first transistor having its collector connected to the emitter of said emitter follower transistor, its base connected to the reference voltage and its emitter connected to the emitter of said second transistor, said second transistor having its collector connected to a first end of a first resistor and its base connected to a first end of a second resistor, the second end of said second resistor being connected to the first end of said first resistor, the second end of said first resistor being connected to the emitter of said emitter follower transistor, the common emitters of said first and second transistors being connected to the ground potential via a third resistor;

a current source enhancement transistor having its collector connected to the emitter of said emitter follower transistor and to the output terminal, its base connected to said second end of said second resistor and its emitter connected to the ground potential via a fourth resistor; and a capacitor having its one end connected to the collector of said input or reference transistor and its other end connected to the base of said second transistor of said buffer means whereby the transient voltage is impressed upon said base of said current source enhancement transistor during logic level transitions at the base of the emitter follower transistor to speed up said transitions on said output terminal.

2. A line driver circuit as claimed in claim 1, further comprising a load current source connected between the emitter of said emitter follower transistor and the ground potential.

3. A line driver circuit as claimed in claim 2, wherein said load current source is formed of a current source transistor and an fifth resistor, said load current source transistor having its collector connected to the emitter of said emitter follower transistor, its base coupled to the emitter of said current source enhancement transistor and its emitter connected to the ground potential via said fifth resistor.

4. An ECL line driver circuit for driving line loads having significant capacitance comprising:

an input transistor having its collector connected to a supply potential and its base connected to receive an input logic signal;

a reference transistor having its collector connected to the supply potential via a load resistor, its base connected to a bias voltage, and its emitter connected to the emitter of said input transistor;

a main current source transistor having its collector connected to the common emitters of said input transistor and said reference transistor, its base connected to a reference valtage, and its emitter connected to a ground potential via an emitter resistor;

an emitter follower transistor having its collector connected to the supply potential, its base connected to the collector of said reference transistor, and its emitter connected to an output terminal;

dynamic current enhancement means responsive to a transient signal at the collector of said reference transistor for reducing the propagation delay at said output terminal; and said dynamic current enhancement means including buffer means formed of a first transistor and a second transistor for amplifying and inverting a transient voltage at the collector of said reference transistor, said first transistor having its collector connected to the emitter of said emitter follower transistor, its base connected to the reference voltage and its emitter connected to the emitter of said second transistor, said second transistor having its collector connected to a first end of a first resistor and its base connected to a first end of a second resistor, the base of said second transistor being further coupled to the collector of said reference transistor, the second end of said second resistor being connected to the first end of said first resistor, the second end of said first resistor being connected to the emitter of said emitter follower transistor, the common emitters of said first and second transistors being connected to the ground potential via a third resistor.

5. A line driver circuit as claimed in claim 4, wherein said dynamic current enhancement means further includes a current source enhancement transistor having its collector connected to the emitter of said emitter follower transistor and to the output terminal, its base connected to the second end of said second resistor and its emitter connected to the ground potential via a fourth resistor.

6. A line driver circuit as claimed in claim 5, wherein said dynamic current enhancement means further includes dynamic charge pumping means formed of a capacitor, one end of the capacitor being connected to the collector of said reference transistor, the other end of the capacitor being connected to the base of said second transistor.

7. A line driver circuit as claimed in claim 6, further comprising a load current source connected between the emitter of said emitter follower transistor and the ground potential.

8. A line driver circuit as claimed in claim 7, wherein said load current source is formed of a load current source transistor and a fifth resistor, said load current source transistor having its collector connected to the emitter of said emitter follower transistor, its base coupled to the emitter of said current source enhancement transistor and its emitter connected to the ground potential via said fifth resistor.

* * * * *